United States Patent [19]

Koinuma

[11] Patent Number: 4,687,955
[45] Date of Patent: Aug. 18, 1987

[54] SCHMITT CIRCUIT WITH MIS FIELD EFFECT TRANSISTORS

[75] Inventor: Hiroyuki Koinuma, Yokohama, Japan

[73] Assignee: Kabushiki Kaisha Toshiba, Kawasaki, Japan

[21] Appl. No.: 912,006

[22] Filed: Sep. 26, 1986

[30] Foreign Application Priority Data

Sep. 30, 1985 [JP] Japan .................. 60-214545

[51] Int. Cl.[4] .................. H03K 3/29; H03K 3/26; H03K 5/153; H03K 19/017
[52] U.S. Cl. .................. 307/290; 307/279; 307/359; 307/448
[58] Field of Search .............. 307/290, 279, 448, 450, 307/451, 576, 579, 584, 585, 443, 359

[56] References Cited

U.S. PATENT DOCUMENTS 4,475,048 10/1984 Miyake et al. .................. 307/290
4,506,168 3/1985 Uya .................. 307/290

Primary Examiner—Stanley D. Miller
Assistant Examiner—Trong Quang Phan
Attorney, Agent, or Firm—Oblon, Fisher, Spivak, McClelland & Maier

[57] ABSTRACT

This invention provides a Schmitt circuit comprising: a first transistor of depletion type, in which the drain is connected to a first power source and the gate and the source are connected to each other; second and third transistors of enhancement type are connected in series between the node where the gate and the source of the first transistor are connected together and a second power source, and the gates of the second and third transistors are connected to each other; a fourth transistor of enhancement type, in which the drain is connected to the first power source and the gate is connected to the node where the gate and source of the first transistor are connected together; a fifth transistor of depletion type, in which the drain is connected to the source of the fourth transistor and the gate and source are connected together and are connected to the node where the source of the second transistor and the drain of the third transistor are connected together; an input terminal inputted an input signal at the node where the gates of the second and third transistors are connected together; and an outut terminal outputting an output signal from the node where the gate and source of the first transistor are connected together.

5 Claims, 6 Drawing Figures

SCHMITT CIRCUIT WITH MIS FIELD EFFECT TRANSISTORS

BACKGROUND OF THE INVENTION

1. Field of the Invention

This invention relates to a Schmitt circuit which is used as input circuits for, for example, MIS (insulated gate) type semiconductor integrated circuits and, in particular, the Schmitt circuit in which MIS type field effect transistors are used.

2. Description of the Prior Art

FIG. 1 shows a conventional example of this kind of Schmitt circuit. That is to say Q1, Q2, Q3 an Q4 are all N channel MIS type (for example, MOS type) field effect transistors. Of these, Q2, Q3 and Q4 are enhancement type (E type) and Q1 is depletion type (D type). The drain of said D type transistor Q1 is connected to the VDD power source node while its gate and source are connected to each other. Between this common connection point N2 and the VSS potential terminal (the earth potential terminal), E type transistors Q2 and Q3 are connected in series. The gates of transistors Q2 and Q3 are connected together and this point is the signal input node N1. The common connection point N2 is the signal output node. The E type transistor Q4 is connected between the VDD power source node and the point A where the source and drain of transistors Q2 and Q3 are connected together. The gate of transistor Q4 is connected to output node N2.

Concerning the operation of an MIS type Schmitt circuit, as is well known, it operates as an inverter circuit in which the circuit threshold voltage differs when the input signal voltage for input node N1, rises and when it falls. Here, when taking the input signal as $\phi_{IN}$, the output signal of output node N2 as $\phi_{OUT}$, the circuit threshold voltage when the input voltage rises as VON and the circuit threshold voltage when the input voltage falls as VOFF, the input/output curve possesses a hysteresis characteristic as shown in FIG. 3. That is to say, in the case of the input voltage when it changes in the higher voltage direction but is lower than the circuit threshold voltage VON when the input voltage rises, transistor Q2 is OFF, and a high (H) level output voltage (=VDD) appears at output node N2 from the VDD power source node via transistor Q1. At this time, transistor Q4 is ON and potential VA at connection point A is approximately potential VDD or the level determined by the ratio of the conducting resistances of transistors Q4 and Q3. When the input voltage changes in the higher voltage direction and exceeds voltage VON, transistors Q2 and Q3 are respectively ON and output signal $\phi_{OUT}$ is low (L) level which is determined by the ratio of the conducting resistance of transistor Q1 and the conducting resistances of transistors Q2 and Q3. At this time transistor Q4 is OFF and the connection point potential VA is almost earth potential. Next, when the input voltage changes in the lower direction, the conduting resistances of Q2 and Q3 rise in conjunction with this and so the voltage of output signal $\phi_{OUT}$ rises and transistor Q4 is in the ON position. Because of this, connection point potential VA rises and causes the conducting resistance of transistor Q2 to increase, and the potential of output signal $\phi_{OUT}$ and connection point potential VA rise further. When this voltage VA has risen to a certain value, transistor Q2 takes the OFF position and the potential of output signal $\phi_{OUT}$ reaches the H level of VDD potential. The voltage of input signal $\phi_{IN}$ at this time is the circuit threshold voltage VOFF when the input voltage falls.

In this way, from the fact that connection point potential VA differs according to the rising and falling of the input voltage, the circuit threshold value VON when the input voltage rises differs from circuit threshold value VOFF when the input voltage falls, and therefore the relationship VON > VOFF is established.

In the conventional MIS type Schmitt circuit described above, the circuit threshold value VON when the input voltage rises depends on the potential of connection point A which is determined by the ratio of the conducting resistance of transistor Q3 and that of Q4, and the circuit threshold value VOFF when the input voltage falls depends on the potential of connection point A which is determined by the ratio of the conducting resistances of transistors Q2 and Q3 and the conducting resistance of transistor Q1 which is its load element. The VDD power source voltage dependencies of the voltages VON and VOFF are shown in FIG. 4. The power source voltage dependency of voltage VOFF is comparatively small, but the power source voltage dependency of voltage VON is large.

Therefore, in the case, for example, of using an MIS type Schmitt circuit in the external signal input circuit of an MIS semiconductor integrated circuit, there is a problem in that when, as described above, there is a large power source voltage dependency in its circuit threshold values VON and VOFF, the speed of operation of the integrated circuit's inner circuit reduces. In the case where the operating mode of the inner circuit is specified by the timing relationships of multiple input signals, since it is difficult to grasp the timing relationships accurately, this causes great obstacles. That is to say, when taking account of fluctuation of the power source voltage, the fluctuation margin in the mutual timing relationships of multiple input signals is small.

SUMMARY OF THE INVENTION

This invention came about after considering the above various facts. It provides a Schmitt circuit by which the power source voltage dependencies of the circuit threshold voltages can be made comparatively small, and in the case of grasping the mutual timing relationships of each input signal by using multiple circuits, it becomes possible to detect accurately the mutual timing relationships between input signals, even for power source and voltage fluctuation.

That is to say, the Schmitt circuit of this invention has the characteristic of being composed of the following transistors. A first transistor of D type whose drain is connected to the VDD power source node and which is connected to the output node by connecting its gate and source to each other. Second and third transistors of E type are connected in series between the mutual connection point of the gate and source of the first transistor and the VSS potential terminal, and which are connected to the input node by common connection of their gates. A fourth transistor of E type whose drain is connected to the VDD power source node and whose gate is connected to the output node. A fifth transistor of D type whose drain is connected to the source of the fourth transistor and which is connected to the series connection point of the second and third transistors by connecting its source and gate to each other.

By this means, when the input voltage rises, the potential at the series connection point of the second and third transistors can be approximately determined by the conducting resistance of the third transistor and the conducting resistance of the fifth transistor which is its load element. Thus the source voltage dependency of the circuit threshold voltage VON when the input voltage rises becomes comparatively small. Therefore, in the case of grasping the mutual timing relationships of each input signal by using multiple Schmitt circuits, the mutual timing relationship of the input signals can be accurately detected since timing detection of each circuit can be accurately carried out even if there is power source fluctuation.

This invention provides a Schmitt circuit comprising: a first transistor of depletion type, in which the drain is connected to a first power source and the gate and the source are connected to each other; second and third transistors of enhancement type are connected in series between the node where the gate and the source of the first transistor are connected together and a second power source, and the gates of the second and third transistors are connected to each other; a fourth transistor of enhancement type, in which the drain is connected to the first power source and the gate is connected to the node where the gate and source of the first transistor are connected together; a fifth transistor of depletion type, in which the drain is connected to the source of the fourth transistor and the gate and the source are connected together and are connected to the node where the source of the second transistor and the drain of the third transistor are connected together; an input terminal inputted an input signal at the node where the gates of the second and third transistors are connected together; and an output terminal outputting an output signal from the node where the gate and source of the first transistor are connected together.

DETAILED DESCRIPTION OF THE PREFERRED EMBODIMENT

Below is a detailed explanation of an actual example of this invention with reference to diagrams.

Figure 1:
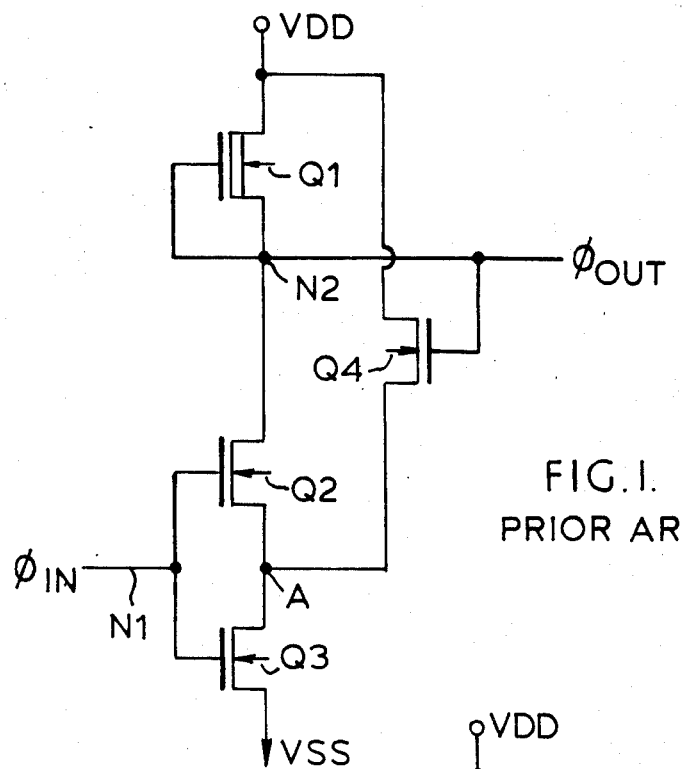
FIG. 1 is a circuit of a conventional insulated gate type Schmitt circuit.
Figure 2:
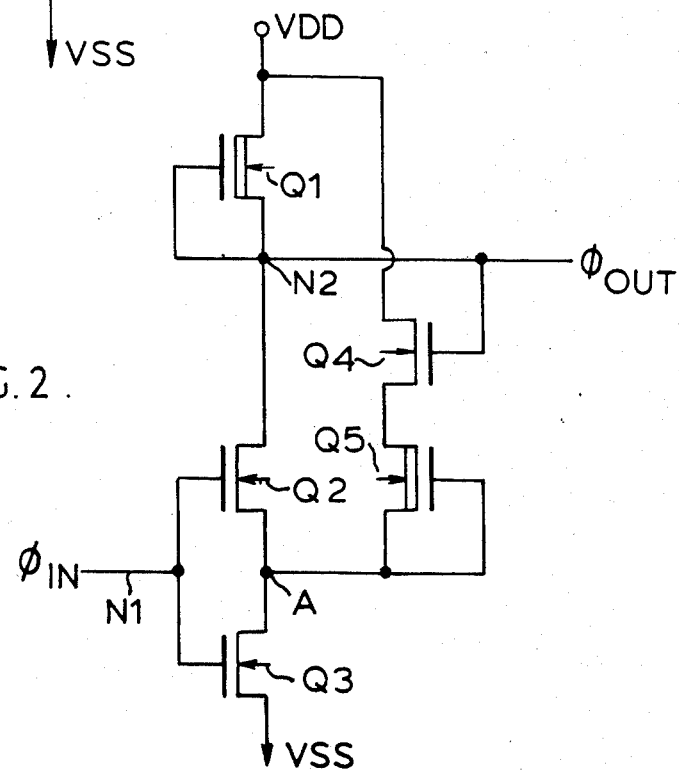
FIG. 2 is a circuit diagram of a first embodiment of a Schmitt circuit of this invention.

The MIS type Schmitt circuit shown in FIG. 2, as opposed to the conventional MIS type Schmitt circuit described previously and shown in FIG. 1 for reference, is modified by inserting an N channel D type field effect transistor Q5, in which the gate and the source are connected in common, between the common connection point A of transistors Q2 and Q3 and the source of transistor Q4. In order to abbreviate the description, the parts which are the same as in FIG. 1 given the same symbols.

The operation of this Schmitt circuit is almost the same as that of the conventional type. However, it differs in that the potential at connection point A when the input voltage rises can be determined by the ratio of the conducting resistance of transistor Q3, the conducting resistance of D type transistor Q5 which is the load element and the conducting resistance of transistor Q4.

That is to say, when the input voltage is "L" level, transistor Q2 is OFF, the output voltage is "H" level and transistor Q4 is ON. When the input voltage changes in the higher direction, firstly the conducting resistance of transistor Q3 reduces and connection point potential VA falls since it is determined by the ratio of the conducting resistances of transistors Q4, Q5 and Q3. When the connection point potential VA falls to the level at which transistor Q2 becomes ON, the level of output signal $\phi_{OUT}$ also falls and finally the output signal $\phi_{OUT}$ becomes "L" level and transistor Q4 becomes OFF. The voltage of the input signal $\phi_{IN}$ at this time is the circuit threshold VON when the input voltage rises.

Therefore, if the dimensions of transistor Q4 are made comparatively large and its resistance is set low, since connection point potential VA when the input voltage rises is mainly determined by the ratio of the conducting resistance of transistor Q3 and the conducting resistance of D type transistor Q5 which is its load element, the power source voltage dependency of circuit threshold value VON when the input voltage rises becomes comparatively small.

Incidentally, when the input voltage changes in the lower direction, the voltage of output signal $\phi_{OUT}$ rises in conjunction due to the rise of the conducting resistances of transistors Q2 and Q3, and transistor Q4 becomes ON. By this means, the conducting resistance of transistor Q2 will be increased due to the rise in potential at connection point A which is supplied via transistors Q4 and Q5 from power source VDD, and the potential of output signal $\phi_{OUT}$ and connection point potential VA both rise further. When this potential VA rises to a certain value, transistor Q2 becomes OFF and the potential of output signal $\phi_{OUT}$ becomes VDD potential. The voltage of input signal $\phi_{IN}$ at this time is the circuit threshold voltage VOFF when the input voltage falls.

Figure 3:
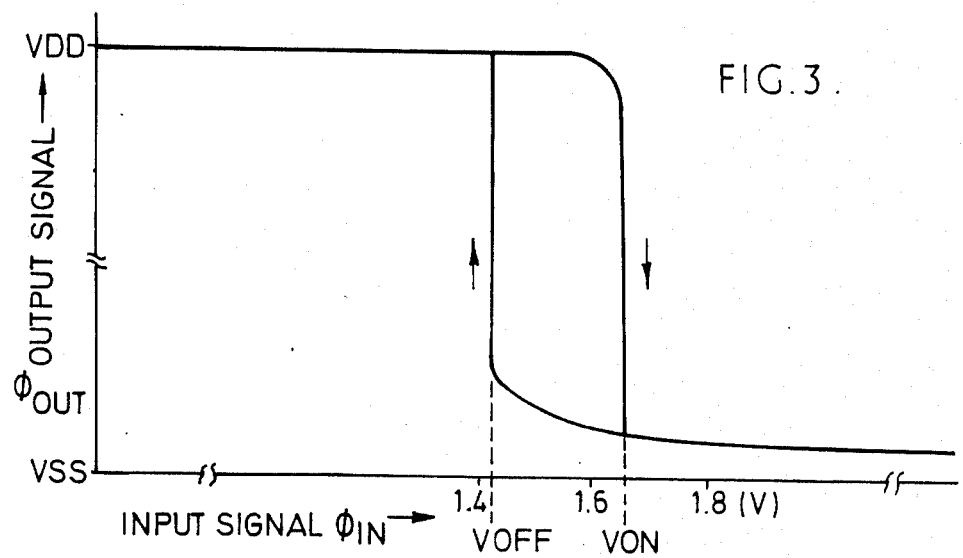
FIG. 3 shows the input/output characteristics of the circuit in FIG. 2.
Figure 4:
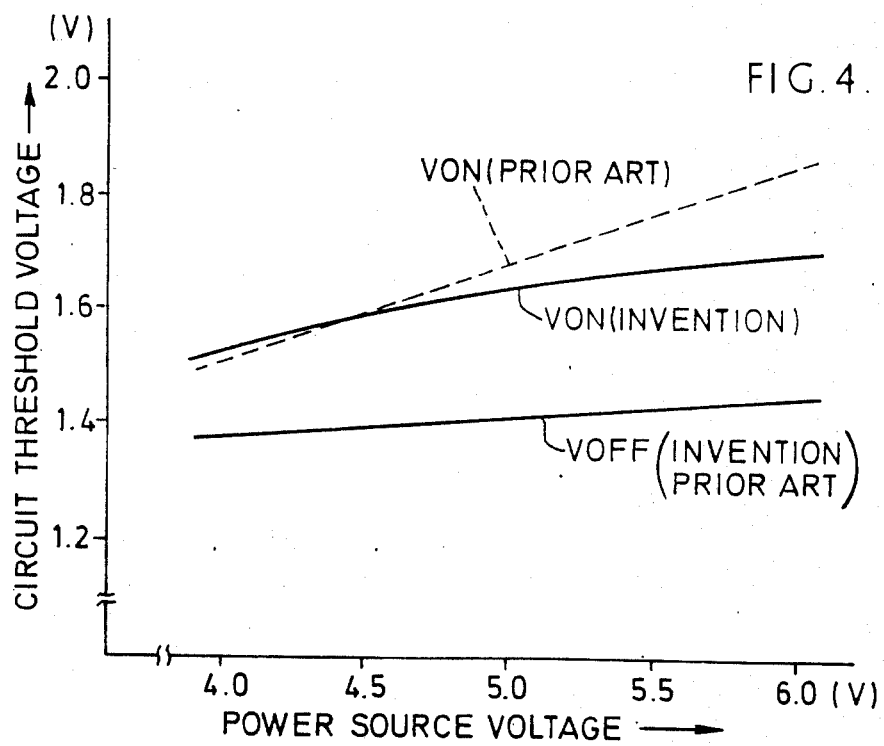
FIG. 4 is curves showing the power source voltage dependencies of the circuit threshold voltage VON when the input voltage rises and the circuit threshold voltage VOFF when the input voltage falls.

By the operation described above, this Schmitt circuit has input/output curves which have the hysteresis characteristics shown in FIG. 3 in the same way as in the conventional example. Also, the power source voltage dependencies of the circuit threshold voltage VON when the input voltage rises and of the circuit threshold voltage VOFF when the input falls in this Schmitt circuit are as shown in FIG. 4. In particular, a marked improvement can be seen when the curve of voltage VON in compared with that of the conventional example indicated by the pecked line.

Figure 5:
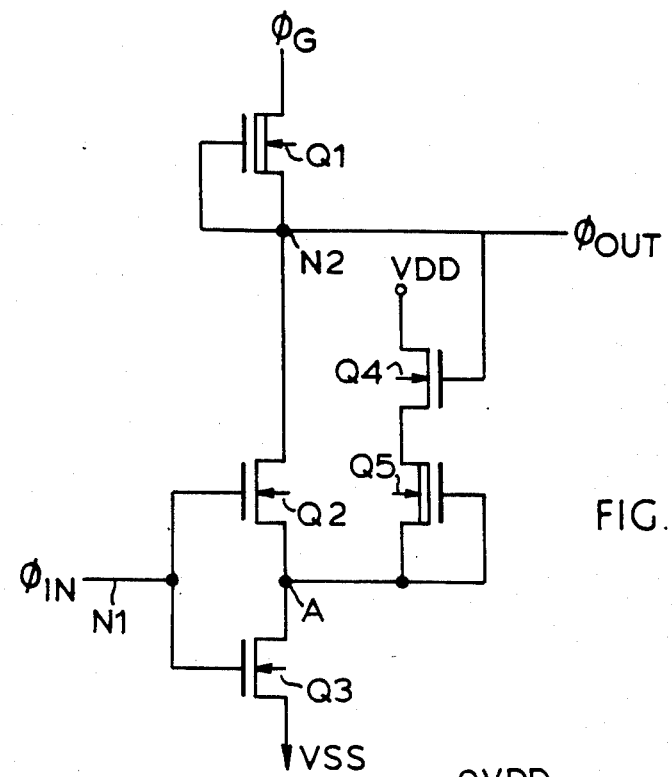
FIG. 5 is a circuit diagram of a second embodiment of a Schmitt circuit of this invention.

FIG. 5 is a circuit diagram of a second embodiment of the Schmitt circuit of this invention. The drain of the D type transistor Q1 is connected to VDD power source voltage as shown in FIG. 2. In the second embodiment, the drain of the D type transistor Q1 is connected to the other power source voltage, for example a power source voltage VG made in the circuit of the same chip. The output voltage is selected by means of selecting the power source voltage VG, because the power source voltage VG is outputted at the output node, when the first transistor is ON. The circuit characteristic is same as that of first embodiment as shown in FIGS. 3 and 4.

Figure 6:
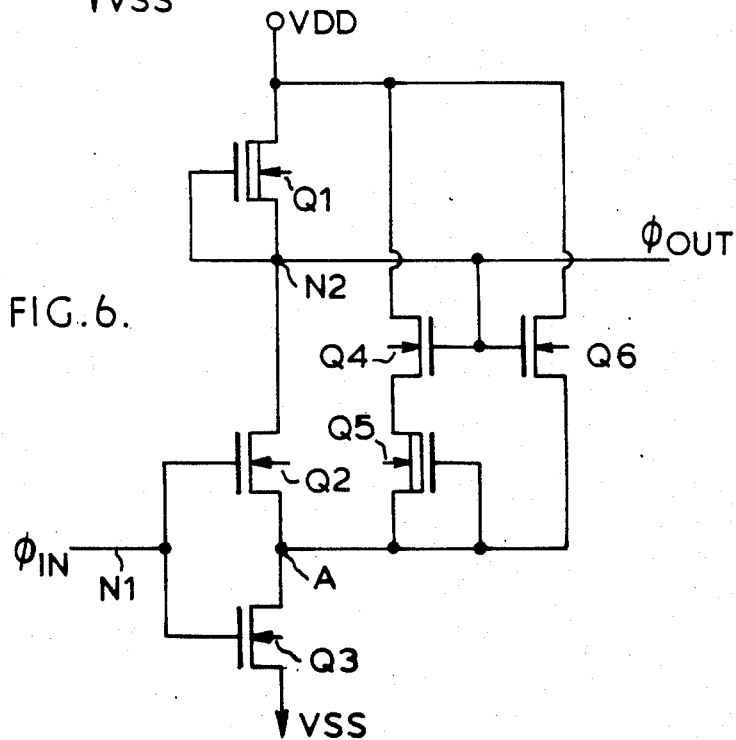
FIG. 6 is a circuit diagram of a third embodiment of a Schmitt circuit of this invention.

FIG. 6 is a circuit diagram of a third embodiment of the Schmitt circuit of this invention. As shown in FIG. 6, E-type transistor Q6 is added to the circuit in FIG. 2.

The gate of the transistor Q6 is connected to the output node, the drain is connected to the VDD power source, the source is connected to the node A. The characteristic of this circuit adding the transistor Q6 can be obtained the middle characteristic between that of the prior art and that of first embodiment as shown in FIGS. 2.

As described above, when using the Schmitt circuit of this invention, the power source voltage dependency of the circuit threshold voltage can be made comparatively small. Thus, in the case of grasping the mutual timing relationships of input signals by using multiple Schmitt circuits, it becomes possible to detect accurately the mutual timing relationships even for fluctuations of power source voltage, and it is suitable for use for external signal input circuits in semiconductor integrated circuits.

Various modification and variations could be made to the invention without departing from the scope or spirit of the invention.

What is claimed is:

1. A Schmitt circuit comprising:
   a first transistor of depletion type, in which the drain is connected to a first power source and the gate and the source are connected to each other;
   second and third transistors of enhancement type are connected in series between the node where the gate and the source of the first transistor are connected together and a second power source, and the gates of the second and third transistors are connected to each other;
   a fourth transistor of enhancement type, in which the drain is connected to the first power source and the gate is connected to the node where the gate and source of the first transistor are connected together;
   a fifth transistor of depletion type, in which the drain is connected to the source of the fourth transistor and the gate and the source are connected together and are connected to the node where the source of the second transistor and the drain of the third transistor are connected together;
   an input terminal inputted an input signal at the node where the gates of the second and third transistors are connected together; and
   an output terminal outputting an output signal from the node where the gate and source of the first transistor are connected together.

2. A Schmitt circuit according to claim 1, wherein the Schmitt circuit is used as an external signal input circuit in semiconductor integrated circuits.

3. A Schmitt circuit according to claim 1, wherein each of the transistors is N channel type, the first power source is of a higher potential than the second power source and the second power source is earth potential.

4. A Schmitt circuit according to claim 1, wherein the first transistor, in which the drain is connected to a third power source and the drain of the fourth transistor is connected to the first power source.

5. A Schmitt circuit according to claim 1, wherein the Schmitt circuit further comprises a sixth transistor of enhancement type, in which the drain is connected to the first power source, the gate is connected to the node where the gate and source of the first transistor are connected together, and the source is connected to the node where the second and third transistor are connected together.

* * * * *